(12) United States Patent
Rearick et al.

(10) Patent No.: US 7,519,875 B2
(45) Date of Patent: Apr. 14, 2009

(54) METHOD AND APPARATUS FOR ENABLING A USER TO DETERMINE WHETHER A DEFECTIVE LOCATION IN A MEMORY DEVICE HAS BEEN REMAPPED TO A REDUNDANT MEMORY PORTION

(75) Inventors: Jeffrey R. Rearick, Fort Collins, CO (US); Louise A. Koss, Fort Collins, CO (US); Mary Louise Nash, Fort Collins, CO (US); Dale R. Beucler, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 241 days.

(21) Appl. No.: 11/208,681

(22) Filed: Aug. 22, 2005

(65) Prior Publication Data
US 2006/0039211 A1    Feb. 23, 2006

Related U.S. Application Data

(60) Provisional application No. 60/603,437, filed on Aug. 20, 2004.

(51) Int. Cl.
*G06F 3/00*   (2006.01)
*G06F 11/00*  (2006.01)

(52) U.S. Cl. .......................... 714/710; 714/8
(58) Field of Classification Search ................. 714/710, 714/718, 2, 3, 6–8, 25; 365/200, 201
See application file for complete search history.

(56) References Cited

U.S. PATENT DOCUMENTS

| | | |
|---|---|---|
| 5,301,156 A | 4/1994 | Talley |
| 5,515,383 A | 5/1996 | Katoozi |
| 5,577,050 A | 11/1996 | Bair et al. |
| 5,742,556 A | 4/1998 | Tavrow et al. |
| 5,764,577 A | 6/1998 | Johnston et al. |
| 5,764,878 A | 6/1998 | Kablanian et al. |
| 5,881,263 A * | 3/1999 | York et al. ................... 712/217 |
| 6,021,512 A | 2/2000 | Lattimore et al. |
| 6,065,134 A | 5/2000 | Bair et al. |
| 6,067,262 A | 5/2000 | Irrinki et al. |
| 6,076,176 A | 6/2000 | Priore et al. |
| 6,076,179 A * | 6/2000 | Hendricks et al. ........... 714/742 |
| 6,081,463 A * | 6/2000 | Shaffer et al. ................ 365/200 |
| 6,163,490 A * | 12/2000 | Shaffer et al. ................ 365/200 |
| 6,185,709 B1 | 2/2001 | Dreibelbis et al. |
| 6,366,508 B1 | 4/2002 | Agrawal et al. |
| 6,408,401 B1 | 6/2002 | Bhavsar et al. |
| 6,609,222 B1 | 8/2003 | Gupta et al. |
| 6,671,822 B1 | 12/2003 | Asher et al. |

(Continued)

*Primary Examiner*—Phung M Chung

(57) ABSTRACT

The invention provides a method and an apparatus for enabling a user to determine whether a defective location in a memory device of an integrated circuit (IC) has been remapped to a location in a redundant memory portion of the memory device. Users are provided with the ability to observe the remapping, and preferably, to determine which locations in the memory device have been remapped. The memory device includes remapping observation logic that causes bits associated with remapping to be output from the memory device. Preferably, a computer receives the remapping bits and displays a description of any remapping on a display monitor. Therefore, not only is a user able to determine whether remapping has occurred, but also which locations in the memory device have been remapped.

19 Claims, 9 Drawing Sheets

U.S. PATENT DOCUMENTS

| | | |
|---|---|---|
| 6,691,252 B2 | 2/2004 | Hughes et al. |
| 6,691,264 B2 | 2/2004 | Huang |
| 6,697,290 B2 | 2/2004 | Koss |
| 6,785,170 B2 * | 8/2004 | Paul et al. .................. 365/200 |
| 6,829,176 B2 * | 12/2004 | Callaway et al. ....... 365/189.01 |
| 6,914,833 B2 | 7/2005 | Koss |
| 7,055,075 B2 | 5/2006 | Koss |
| 7,159,141 B2 * | 1/2007 | Lakhani et al. ................ 714/8 |
| 7,212,456 B2 * | 5/2007 | Callaway .................... 365/201 |
| 7,260,758 B1 * | 8/2007 | Agrawal et al. ............. 714/733 |
| 2004/0062095 A1 | 4/2004 | Templeton et al. |
| 2007/0074070 A1 * | 3/2007 | Lakhani et al. ................ 714/8 |

* cited by examiner

| CHIP_RUN_BIST | CHAIN_PASS_OUT | CHAIN_FAIL_OUT | MEANING |
|---|---|---|---|
| 1 | 0 | 0 | BIST HAS NOT COMPLETED |
| 1 | 1 | 0 | BIST HAS COMPLETED AND PASSED |
| 1 | 0 | 1 | BIST HAS COMPLETED AND FAILED |
| 0 | 0 | X | USER HAS RUN BIST AND RELEASED THE CHIP_RUN_BIST SIGNAL. NO REDUNDANCY WAS USED |
| 0 | 1 | X | USER HAS RUN BIST AND RELEASED THE CHIP_RUN_BIST SIGNAL. REDUNDANCY IS MAPPED IN |

FIG. 4

# METHOD AND APPARATUS FOR ENABLING A USER TO DETERMINE WHETHER A DEFECTIVE LOCATION IN A MEMORY DEVICE HAS BEEN REMAPPED TO A REDUNDANT MEMORY PORTION

CROSS-REFERENCE TO RELATED APPLICATIONS

This application claims priority to and the benefit of the filing date of provisional patent application Ser. No. 60/603,437, filed Aug. 20, 2004, which is incorporated herein by reference in its entirety.

BACKGROUND OF THE INVENTION

ICs typically include built-in-self-test (BIST) logic that enables embedded memory devices to be tested for defects. In some BIST embodiments, extra circuitry is provided such that, if a defect is detected using the BIST logic, it can be repaired, using either a soft repair procedure or a hard repair procedure. It is known to include a redundant memory portion in an IC memory device that is used to repair a defective portion in the memory device. The redundant memory portion normally is never used unless a defective memory portion is detected and a repair is made. Both hard and soft repair procedures result in the redundant memory portion being used to store the data that would have otherwise been stored in the defective memory portion. In essence, the defective memory portion is remapped to the redundant memory portion.

FIG. 1A illustrates a block diagram of a known memory array 10 having a redundant memory portion 30 and remapping logic 20 for remapping a defective memory portion to the redundant memory portion 30. The arrows 21A-21C represent the normal paths for writing data to and reading data from the memory array 10 when no defects have been detected. Each of bit slices 0-2 has remapping logic 20A-20C, respectively, associated with it for allowing remapping to be performed in the event that a defect in one of bit slices 0-2 is detected. As shown in FIG. 1A, under normal operations (i.e., when no defect has been detected), the redundant bit slice 30 is not used.

FIG. 1B illustrates a block diagram of the memory array 10 and remapping logic 20 shown in FIG. 1A configured by the remapping logic 20 to use the redundant bit slice 30. In this example, a defect 22 has been detected in bit slice 1. In response to this defect 22 being detected, the remapping logic 20 reconfigures remapping blocks 20B and 20C so that the portions of the data paths having an "X" on them are not used and new data paths 31A and 31B are activated. Consequently, the data that would have been stored in defective bit slice 1 via data path 21B is now stored in bit slice 2 via data path 31A and the data that would have been stored in bit slice 2 via data path 21C is now stored in the redundant bit slice 30 via data path 31B. All of the bit slices preceding the defective bit slice continue to be used in the normal manner.

With soft repair, the remapping of the data path is performed by storing values in a remapping register of the remapping logic 20 that cause certain logic gates to be turned on and other logic gates to be turned off, thereby causing certain paths through the logic to be activate and others to be inactive. With soft repair, the BIST is run each time the IC is powered on and the remapping logic is configured to repair the memory device if a defect is detected. Because it is possible in some cases for a defect to appear on one occasion when the IC is powered on and not to appear on another occasion (i.e. the defect is intermittent), remapping may occur on one occasion when the IC is powered on and not occur on another. Therefore, the hardware may not be physically configured the same way all of the time.

With hard repair, the remapping of the data paths happens during the production stage. After the IC has been manufactured, it is tested using the BIST logic on the IC and any failing locations are noted. If a defect has been detected, a physical change is made in the repair circuitry corresponding to the failing location to cause the original data path to be remapped to the new data path. Once the new connections have been made, either by blowing an electrical fuse or by cutting a metal link with a laser, the BIST test is run again to ensure that the defect has been repaired. A hard repair is performed only once, during the manufacturing test stage, and is permanent for the lifetime of the IC.

With the current hard repair procedure, the physical configuration of the memory array does not change after the repair has been made, but there is no mechanism for enabling the user of the IC to determine what the exact physical configuration of the IC is after the repair has been made. As stated above, hard repair is made during production and the associated information is not kept with the individual IC, so the end user of the IC has no way of knowing exactly what repairs were made, or indeed if any repairs were made at all.

With the current soft repair procedure, there is also no mechanism for enabling the configuration of repairs to be determined. Furthermore, because the physical configuration of the memory array may not always be the same each time the IC is powered on, it would be desirable to provide a way to enable a user to determine the exact physical configuration of the memory array at any given time.

Accordingly, a need exists for a method and an apparatus that enable an IC user to determine whether a defect in a memory device has been detected and repaired. A need also exists for a method and an apparatus that enable an IC user to determine the location of a defect as well as the configuration of the memory device after a repair has been made.

SUMMARY OF THE INVENTION

The invention provides a method and an apparatus for enabling a user to determine whether a defective location in a memory device of an integrated circuit (IC) has been remapped to a location in a redundant memory portion. Users are provided with the ability to observe the remapping, and preferably, to determine which locations in the memory device have been remapped. The memory device includes remapping observation logic that causes bits associated with remapping to be output from the memory device. Preferably, a computer receives the remapping bits and displays a description of any remapping on a display monitor. Therefore, not only is a user able to determine whether remapping has occurred, but also which locations in the memory device have been remapped.

In accordance with the preferred embodiment, the memory device includes remapping observation logic that a user asserts to cause remapping bits stored in remapping registers to be ported out of the memory device so that they are available at an output port of the memory device. Preferably, the remapping bits are output from the same port that data is output from when it is read out of the memory array of the memory device. A multiplexer selects between data and remap bits. A remapping observation control signal controls the selections made by the multiplexer. When a user asserts the control signal, the multiplexer selects the remap bits to be ported out on the data output port of the IC. Preferably, a computer receives the remap bits and displays them on a display monitor in a format that indicates which locations in the memory array have been remapped to locations in the redundant memory portion.

These and other features and advantages of the invention will become apparent from the following description, drawings and claims.

BRIEF DESCRIPTION OF THE DRAWINGS

FIG. 4 illustrates a logic table that gives an interpretation of various states of signals in a memory device, which can be used to determine whether remapping has occurred.

DETAILED DESCRIPTION OF THE INVENTION

In accordance with the invention, a user of an IC is provided with the ability to determine whether a memory device has been repaired. In accordance with the preferred embodiment of the invention, the IC user not only is provided with the ability to determine that a repair to a memory device has been made, but also the ability to observe the nature of the repair that has been made.

Figure 2:
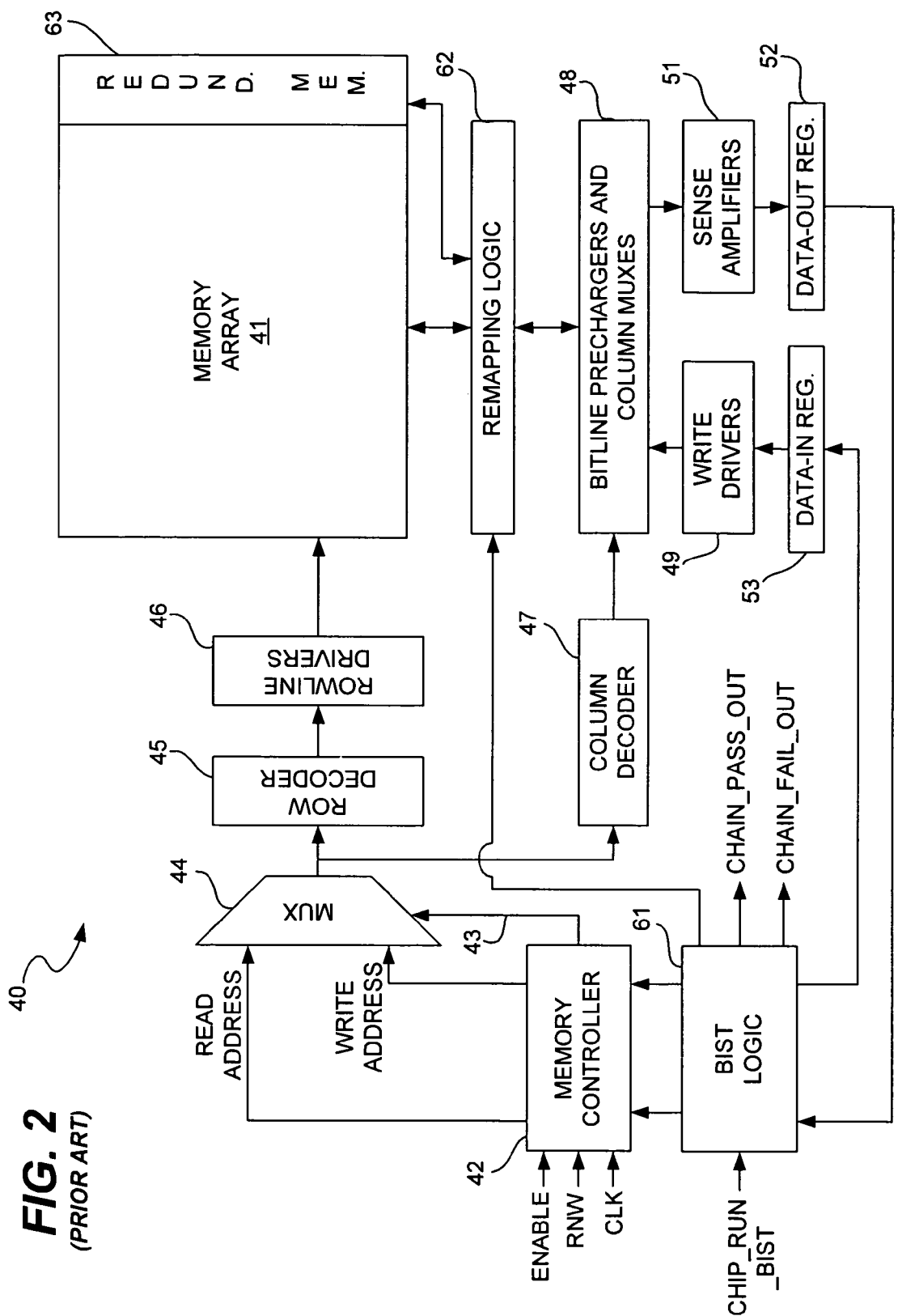
FIG. 2 illustrates a block diagram of an IC that includes a memory array and circuitry for causing data to be written to and read from the memory array.

FIG. 2 illustrates a block diagram of a memory device 40 of an IC that includes a memory array 41 and circuitry for causing data to be written to and read from the memory array 41. The operations of the memory device are as follows. A memory controller 42 outputs read and write addresses to a multiplexer (MUX) 44 and generates a timing signal 43 that controls the selection of the read or write address by the MUX 44. A row decoder 45 decodes the address to obtain an address of a particular row in the memory array 41. A row line driver 46 includes buffers (not shown) that drive the selected row line of the memory array 41.

A column decoder 47 receives the address selected by the MUX 43 and decodes it to obtain an address of a column in the memory array 41. The selected column address is received by bitline prechargers and column multiplexers 48. The bitline prechargers keep the bitlines precharged to the same value when data is not being read from or written to the memory array 41 during one phase of the clock, CLK. The column multiplexers select an address of a particular column in the memory array. The write drivers 49 include buffers that drive the column lines when data is being written to the memory array 41. Sense amplifiers 51 sense data being output from the memory array 41 during a read operation and drive the data being read to the data_out register 52, which temporarily holds data read from the memory array 41. Data to be written to an address in the memory array is temporarily held in the data-in register 53.

The signals Enable, RNW (read not write) and CLK control, via the memory controller 42, writing data to and reading data from the memory array 41. When the Enable signal is asserted and the RNW is asserted, then data is read from the memory array 41 during one phase of CLK. When the Enable signal is asserted and the RNW signal is not asserted, then data is being written to the memory array 41. When the Enable signal is not asserted, data can neither be written to nor read from the memory array 41, so the RNW signal is a "don't care" (i.e. irrelevant).

In order to test the memory array 41 for defects, the memory device 40 includes BIST logic 61. When the BIST logic 61 detects that a CHIP_RUN_BIST signal is asserted, the BIST logic 61 generates a sequence of test patterns consisting of both data and address portions to be written to and later read from the memory array 41. The data portion of each test pattern is first stored in the data_in register 53 before being written to a location in the memory array 41. The BIST logic 61 also generates a corresponding write address that is output to the memory controller 42. The memory controller 42 then causes the data contained in the data_in register 53 to be written to location in the memory array 41 designated by the write address.

Once the data patterns have been written to addresses in the memory array 41, the BIST logic 61 generates read addresses that are output to the memory controller 42 to cause the data to be read from the memory array 41. As the data is read from the read addresses, it is stored temporarily in the data_out register 52 before being received as input by the BIST logic 61. The BIST logic 61 analyzes the data read from the memory array 41 to determine whether the data read from respective addresses in the memory array 41 matches the data originally written to those respective addresses. If data read from a particular address in the memory array 41 does not match the data written to that address, the BIST logic 61 determines that a defect has been detected in the memory array 41. When a defect is detected, the signal output from the BIST logic 61 labeled "Chain_Fail_Out" is asserted. When no defects are detected, the signal output from the BIST logic 61 labeled "Chain_Pass_Out" is asserted. The BIST logic 61 typically runs a variety of different types of tests with different types of test patterns to determine whether the memory array 41 contains defective locations.

Figure 1A:
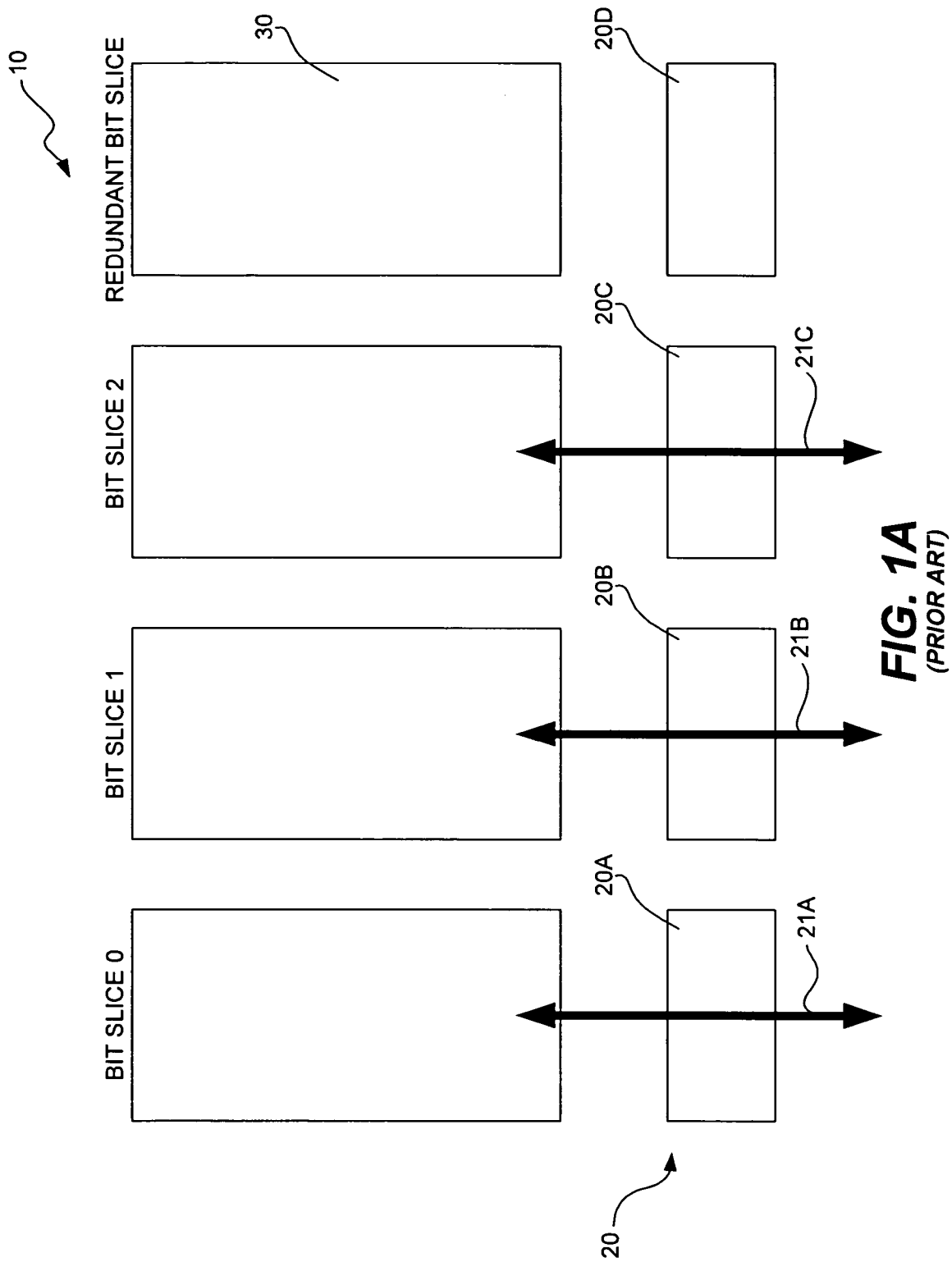
FIG. 1A illustrates a block diagram of a known memory array having a redundant memory portion and remapping logic for remapping a defective memory portion to the redundant memory portion
Figure 1B:
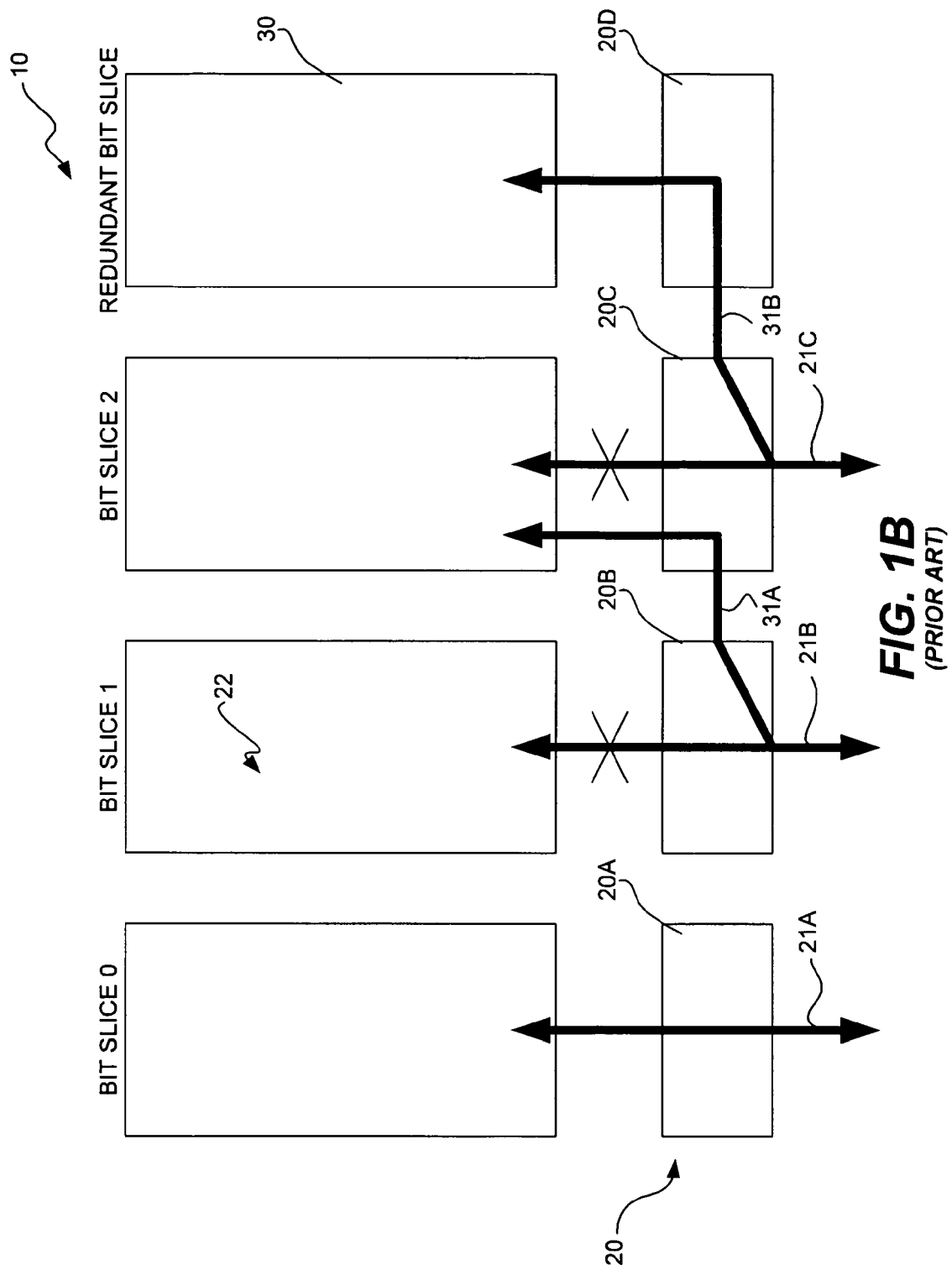
FIG. 1B illustrates a block diagram of the memory array and remapping logic shown in FIG. 1A configured by the remapping logic to use the redundant bit slice.

When the BIST logic 61 detects a defect, the BIST logic 61 configures the remapping logic 62 in the manner described above with reference to FIGS. 1A and 1B to use the redundant memory 63. This is a soft repair procedure during which one or more bit values in registers (not shown) of the remapping logic 62 are set to 1 and others to 0 in order to cause the appropriate remapped data paths to be activated. As can be seen from the block diagram shown in FIG. 2, there is no way in this design to access the values stored in the registers of the remapping logic 62. Also, because defects detected by the BIST logic 61 on one occasion when the IC is powered on may not be detected on another due to intermittency, the values stored on the registers of the remapping logic 62 may change from one powering to the next. Therefore, the user of the IC has no way of knowing the exact configuration of the memory device 40 at any given time.

The present invention provides a variety of techniques that enable a user of an IC to determine, at any given time, whether a defect in the memory array has been detected and repaired. In accordance with the preferred embodiment of the invention, the user is also provided with the ability to observe, at any given time, which locations in the memory array have been remapped to redundant memory.

Figure 3:
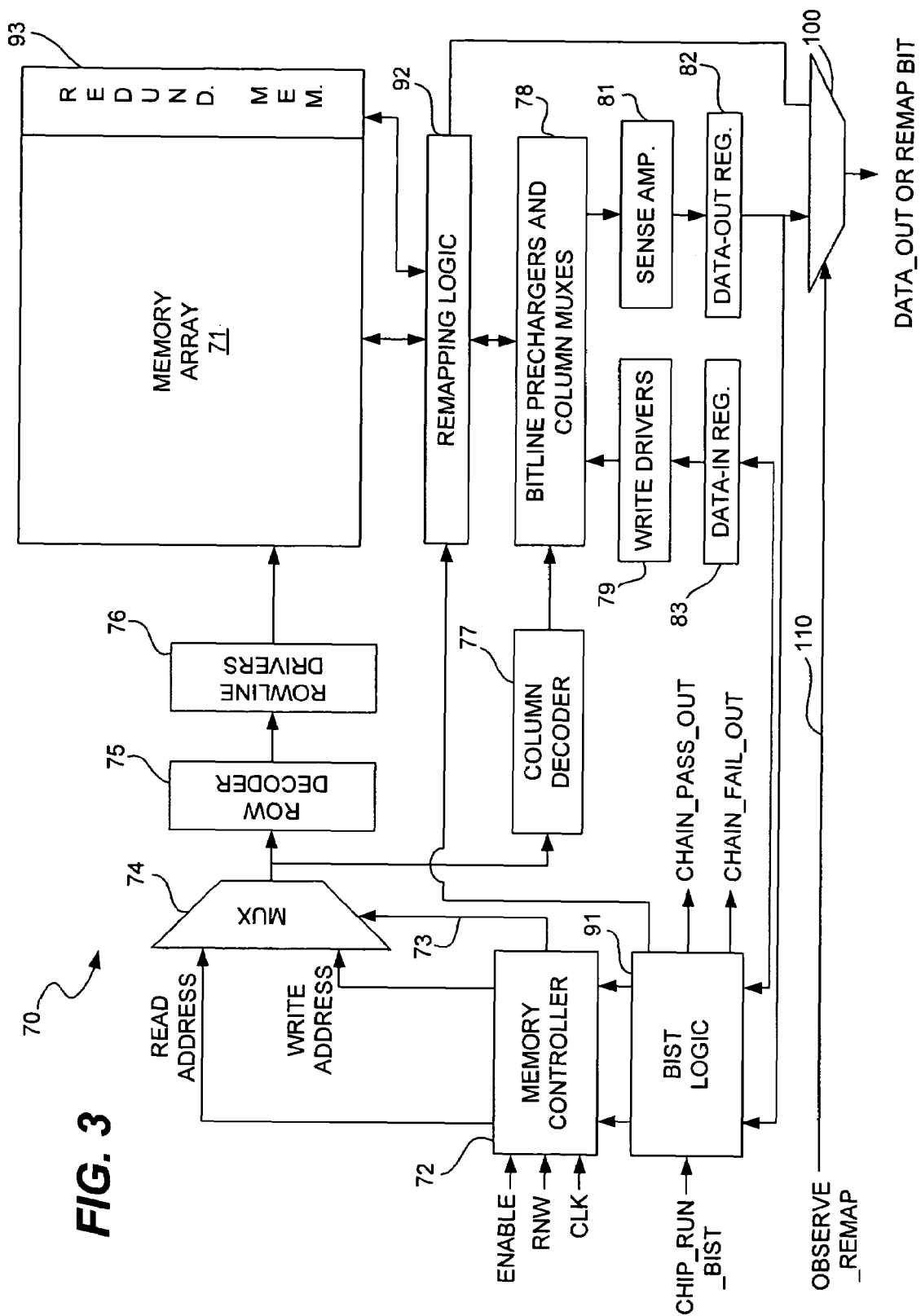
FIG. 3 illustrates a block diagram of an IC that includes a memory array that incorporates remapping observation logic that enables a user to observe the configuration of the remapping logic.

FIG. 3 is a block diagram of a memory device 70 of the invention that incorporates remapping observation logic that enables a user to observe the configuration of the remapping logic. As one example of the manner in which the present invention can be achieved, the invention will be described with reference to its use with a memory device of the type shown in FIG. 2 that uses soft repair remapping. However, as will be understood by those skilled in the art in view of the description provided herein, the invention is not limited with respect to the type of memory device with which it is used or with respect to the manner in which the invention is implemented. Several different exemplary embodiments of the invention are described below in detail.

With reference to the block diagram shown in FIG. 3, the components labeled 72-93 perform identical functions to the components labeled 42-63, respectively, in FIG. 2, which were previously described. Therefore, the operations of components 72-93 will not be described in detail. In accordance with this embodiment of the invention, the memory device 70 includes remapping observation logic that an IC user can use to observe the manner in which the memory array 71 has been remapped by the remapping logic 92. The remapping observation logic comprises a 2-to-1 MUX 100 and a selection signal 110 called "Observe_Remap". When the Observe_Remap signal is not asserted, the memory device 70 operates in the normal manner and data that has been read from the memory device 70 and stored in the data_out register 82 is selected by the MUX 100. However, when the user desires to observe any remapping, the Observe_Remap signal 110 is asserted, thereby causing the MUX 100 to output the state of the remapping logic 92.

One of the advantages of the remapping observation logic 100, 110 of this embodiment is that very little additional circuitry is needed. A single control line is needed to control the selections made by the MUX 100 to cause either data or remapping bits to be output from the memory device 70. Therefore, a single input port is needed to enable the remapping configuration to be observed. No additional output port is required because the remap bits are output through the data_out port when data is not being output through the data_out port and the Observe_Remap signal is asserted. Another advantage of this configuration is that the remapping bits can be observed with minimal disruption to the normal operations of the memory device 70. It is not necessary to stop the clock and scan out the contents of the remap registers. In order to observe the remap bits, the Enable signal is deasserted so that no reads or writes can occur. While the Enable signal is deasserted, the Observe_Remap signal is asserted, thereby causing the remap bits to be selected by the MUX 100. Once the remap bits have been read from the remap logic 92, the memory device 70 can return to normal read and write operations (i.e., the Observe_Remap signal is deasserted and the Enable signal may be re-asserted).

One alternative to the remapping observation logic 100, 110 shown in FIG. 3 would be to port out the contents of the remap registers of the remapping logic 92. However, this alternative typically would require additional output lines to port out the contents of the remap registers, which has a significant negative impact on chip area. Another alternative would be to use the scan flip-flops that comprise the remap register to observe the state of the remap logic. However, typically the clock would need to be stopped to scan out the contents of the remap registers, which is a significant disruption to the chip operation.

Another alternative to the exemplary embodiment shown in FIG. 3 is to use signals that already exist in the memory device to determine whether remapping has occurred. With this alternative embodiment, it is unnecessary to add any additional input ports, output ports or hardware. As stated above with reference to FIG. 2, when a defect is detected, the signal output from the BIST logic 61 labeled "Chain_Fail_Out" is asserted. When no defects are detected, the signal output from the BIST logic 61 labeled "Chain_Pass_Out" is asserted. The states of these signals in combination with the state of the "Chip_Run_Bist" signal can be analyzed using appropriate logic to determine whether remapping has occurred. The manner in which this can be accomplished will now be described with reference to the logic table shown in FIG. 4.

When the Chip_Run_Bist signal is high and the Chip_Pass_Out and Chip_Fail_Out signals are low, this means that BIST has not completed. When the Chip_Run_Bist and the Chip_Pass_Out signals are high and the Chip_Fail_Out signal is low, this means that BIST has completed and passed. When the Chip_Run_Bist signal is high, the Chip_Pass_Out signal is low and the Chip_Fail_Out signal is high, this means that BIST has completed and failed. These first three combinations (corresponding to the first three rows of the table in FIG. 4) represent the minimum necessary functions for testing, repairing, and retesting the memory. The next two combinations represent the extra functionality to indicate the presence or absence of a repair after the BIST test is completed. When the Chip_Run_Bist and the Chip_Pass_Out signals are low, the Chip_Fail_Out signal is a "don't care". The combination of these states means that the user has run BIST, released the Chip_Run_Bist signal, and that no redundancy was used. When the Chip_Run_Bist signal is low and the Chip_Pass_Out signal is high, the Chip_Fail_Out signal is "don't care". The combination of these states means that the user has run BIST, released the Chip_Run_Bist signal, and that redundancy is currently being used. Thus, whether remapping is being used can be determined using existing signals. In this embodiment, the remapping logic is simply logic that performs the Boolean functions needed to make the determination as to whether or not remapping has occurred. The determination as to whether or not remapping has been used (e.g., a single bit) would then be ported out of the IC through an existing I/O port of the IC.

Figure 5:
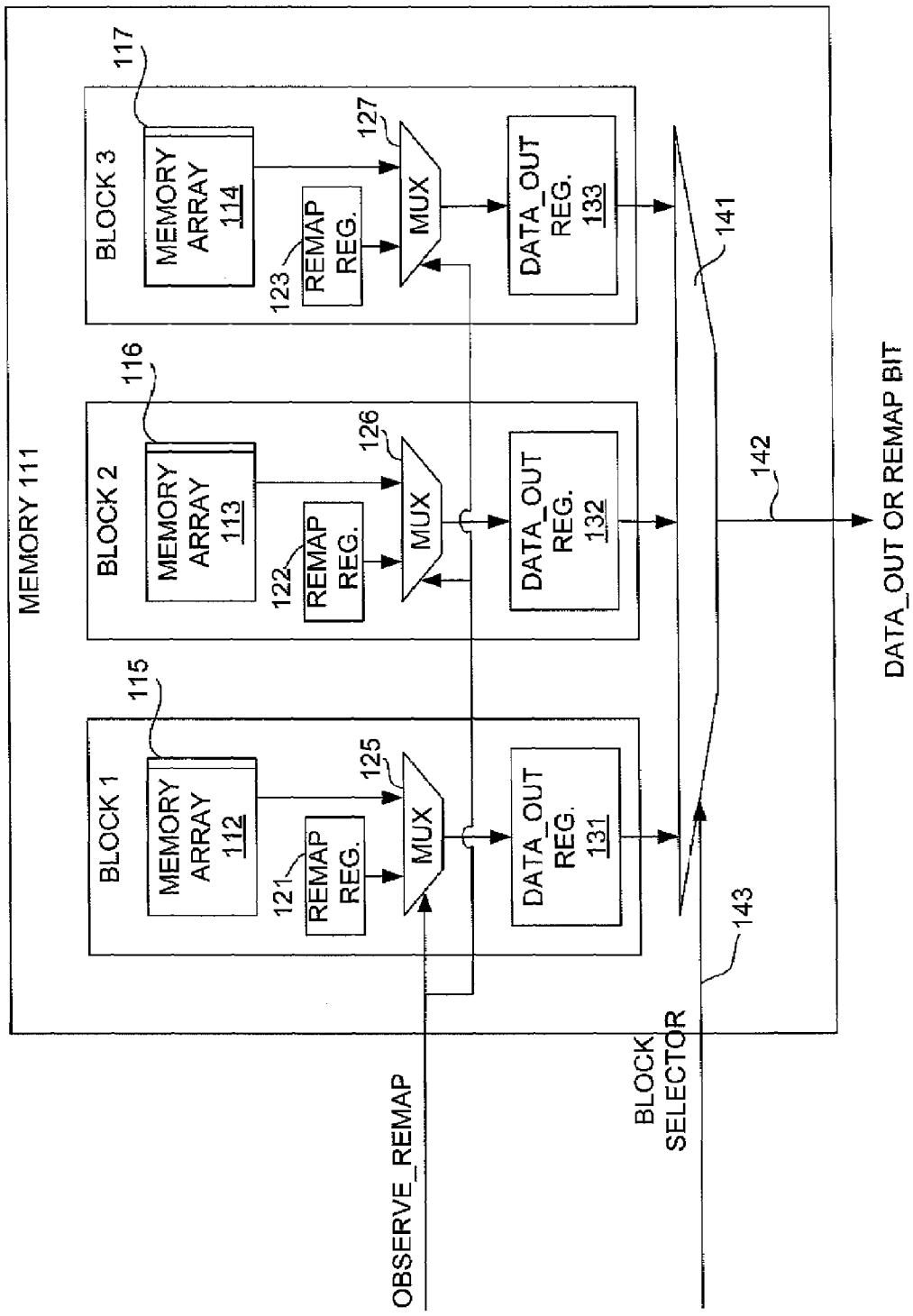
FIG. 5 illustrates a block diagram of a memory device that has three memory blocks and remap logic for enabling remap bits to be ported out of the memory device.

FIG. 5 illustrates a block diagram of a memory element 111 that has three memory blocks, which are labeled Block 1, Block 2 and Block 3. Each memory block has a memory array 112, 113 and 114 and each memory array includes a redundant memory portion 115, 116 and 117. Each memory block also includes a remap register 121, 122 and 123, a 2-to-1 MUX 125, 126 and 127 and a data_out register 131, 132 and 133. Each MUX 125, 126 and 127 receives an Observe_Remap control signal that causes the MUX to select either the value stored in the remap register 121, 122 and 123 or data being read from the associated memory array 115, 116 and 117. The data_out registers 131, 132 and 133 store the values selected by the MUXes 125, 126 and 127. A 3-to-1 MUX 141 selects the output of one of the data_out registers and outputs it onto a data_out line 142. A block selector signal 143 controls which of the data_out registers is selected by the MUX 141.

Whenever one of the memory arrays 112, 113 and 114 has been remapped so that its redundant memory portion 115, 116 and 117 is being used, the associated remap register 121, 122 and 123 will contain at least one logic 1. When redundant memory is not being used, the associated remap register 121, 122 and 123 will contain all logic 0s. When the IC user wishes to observe whether remapping has occurred, the user causes the Observe_Remap signal to be asserted, which causes each MUX 125, 126 and 127 to select the value stored on the associated remap register 121, 122 and 123. This value will then be stored in the respective data_out register 131, 132 and 133. The values stored in the data_out registers 131, 132 and 133 may then be driven out on the data_out lines 142 by using the block selector signal 143.

Figure 6:
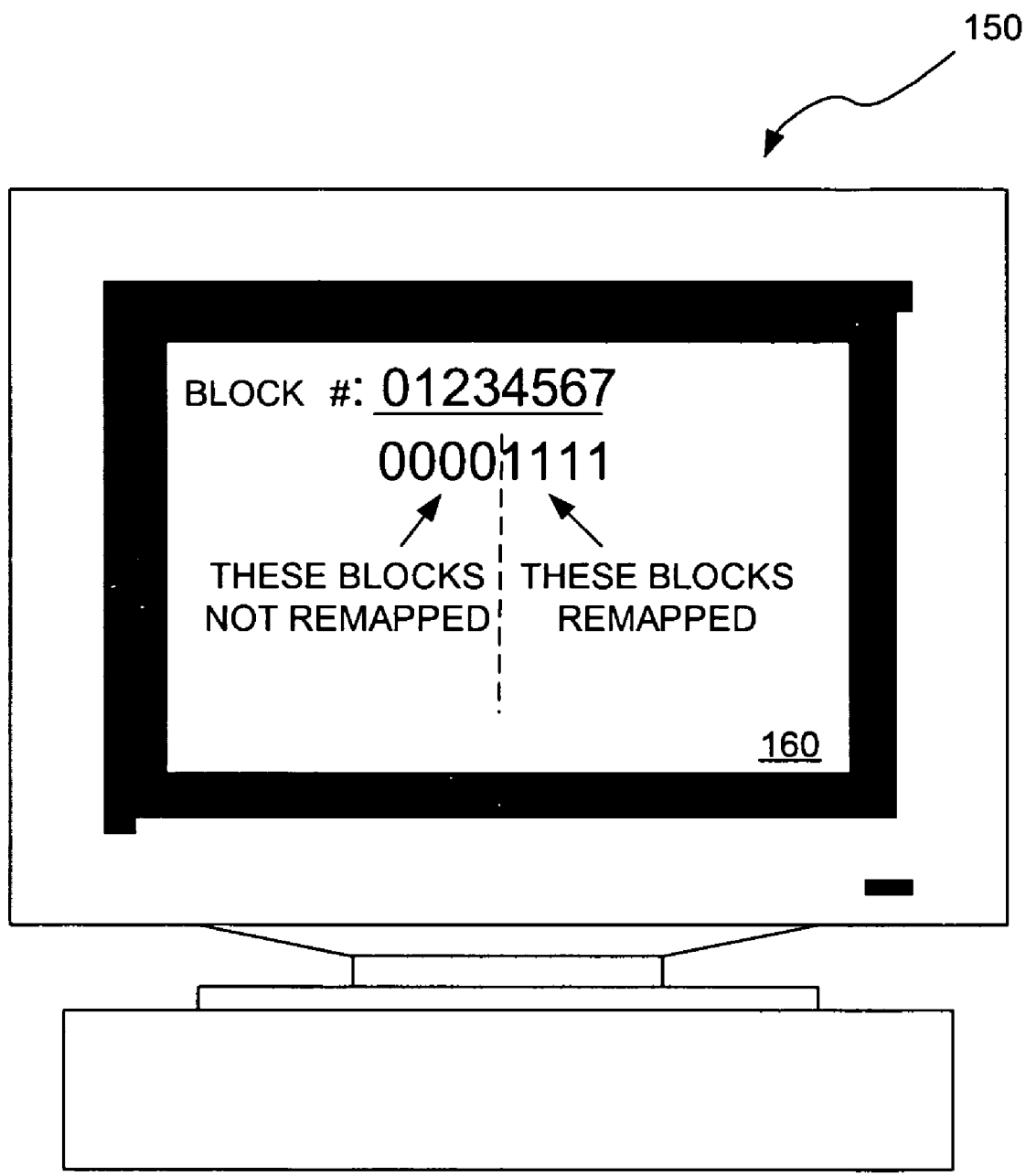
FIG. 6 illustrates a computer that receives remap bits that have been ported out of a memory device and converts them into a suitable format for display on a computer monitor.

One of the advantages of the present invention is that it enables a user to observe whether remapping has been used and which locations in memory have been remapped. In accordance with the preferred embodiment, a computer executing a computer program receives the remap bits ported out on the data_out line 142 and displays the bits on a computer monitor. This is shown in FIG. 6. A computer 150 receives the remap bits and converts them into a suitable format for display on the computer monitor 160. The computer 150 uses the block selector signal 143 to determine which remap bits correspond to the memory blocks.

The invention is not limited with respect to the type of format in which the information is displayed on the monitor 160. The format shown gives the memory block number and, below the block number, a 1 or a 0 to indicate that either remapping has or has not occurred, respectively. Thus, a user can easily ascertain which blocks have been remapped. The user can also identify the position of the bit slice in the memory block which was defective by examining the position of the first logic 1 in the remap register. In addition, preferably the user can activate the Observe_Remap signal shown in FIG. 5 via the computer interface (e.g., using key strokes or a mouse) to cause the remap information to be retrieved and displayed on the monitor 160.

Another advantage of the embodiment shown in FIG. 5 is that, because the data_out lines are used for data and the remap bits, very little circuitry needs to been added to the memory element 111. The only circuitry that has been added are the MUXes 125, 126 and 127, the lines connecting the remap registers 121, 122 and 123 to the respective MUXes 125, 126 and 127, the lines connecting the MUXes 125, 126 and 127 to the respective data_out registers 131, 132 and 133, and the Observe_Remap signal line. All of the other circuitry shown, including the MUX 141 and the block selector signal line, currently exists in memory elements.

Figure 7:
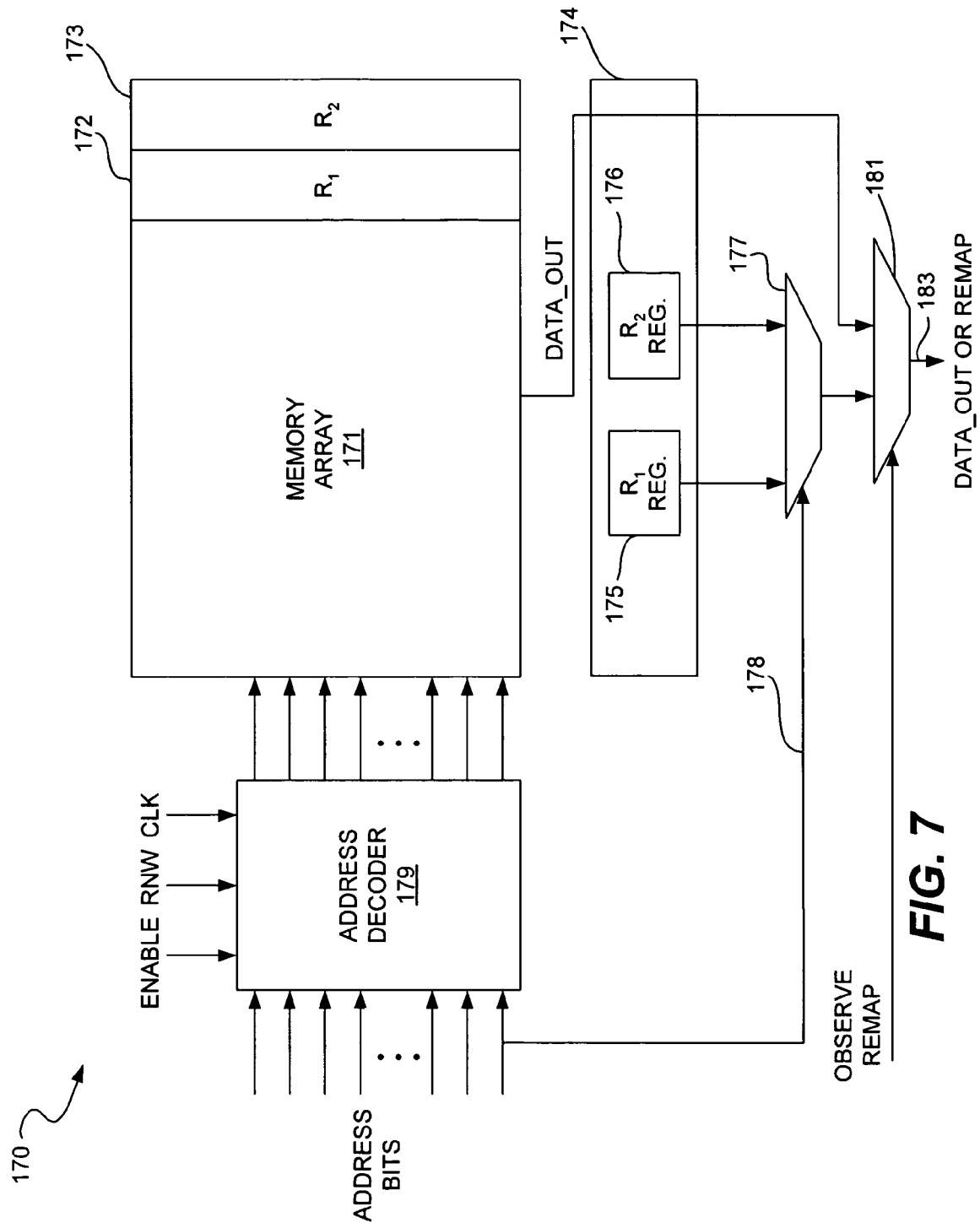
FIG. 7 illustrates a block diagram of a memory device of the present invention that utilizes some additional circuitry in combination with existing address lines to increase memory redundancy.

FIG. 7 illustrates a block diagram of a memory device 170 of the present invention in accordance with another embodiment. This embodiment utilizes some additional circuitry in combination with existing address lines to increase memory redundancy. In this example, a memory array 171 has two columns of redundant memory 172 and 173, which are labeled $R_1$ and $R_2$, respectively. The remapping logic 174 has two remapping registers 175 and 176, which hold the remapping bits for redundant memory $R_1$ 172 and $R_2$ 173, respectively. The two remapping registers 175 and 176 are connected to a 2-to-1 MUX 177. The selector signal 178 of the MUX 177 is one of the bits of the memory address. As described above with reference to FIGS. 2 and 3, the memory array 171 will not be written to or read from when the Enable signal is not asserted. Therefore, in order to read the values from the remapping registers 175 and 176, the Enable signal is held low and the address line 178 is driven high and low to cause the desired one of the registers 175 and 176 to be read and ported out on the data_out line 183.

The address decoder 179 typically includes the circuitry represented in FIG. 3 by blocks 72-82. The 2-to-1 MUX 181 selects between the output of MUX 177 and data read out of the memory array 171. An Observe_Remap signal selects between data read out of the memory array 171 and remap bits read out of the registers 175 and 176. In order for a user to observe the remap bits, the user simply holds the Enable signal low and drives the address line 178 high and low to cause the contents of both registers 175 and 176 to be output from MUX 177. When the Observe_Remap signal is driven high, the remap bits will be output one at a time from the MUX 181 and ported out of the memory device 170. The remap bits may then be processed by the computer 150 and displayed in the manner described above with reference to FIG. 6.

One of the advantages of the memory device 170 shown in FIG. 7 is that it includes multiple redundant memory columns for additional redundancy, which enables more defects to be repaired. Another advantage is that very little additional circuitry is required due the fact that an existing address line is being used to control the porting out of the remap bits and due to the fact that the data_out port is used for both data and the remap bits. It should be noted that although this example is directed to column redundancy, the invention also applies to row redundancy. Those skilled in the art will understand the manner in which remap bits used for row redundancy can be observed using the invention in view of the description provided herein. Furthermore, though this example is directed to two-deep redundancy, those skilled in the art will understand that it applies in principle to deeper levels of redundancy.

Figure 8:
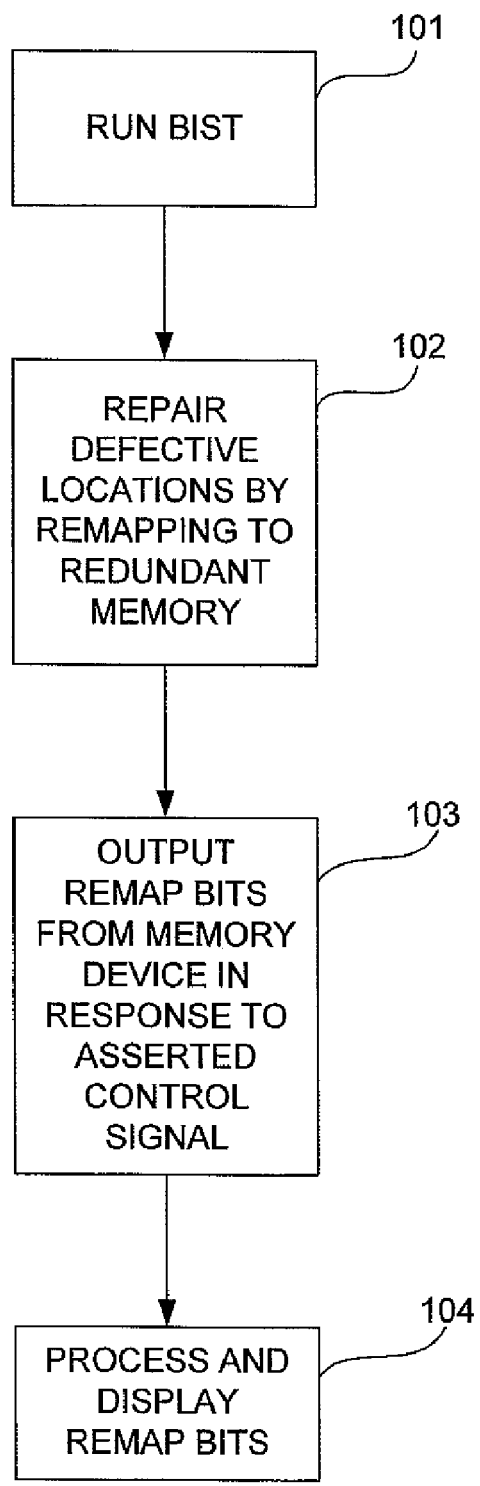
FIG. 8 illustrates a flow chart of the method of the invention in accordance with an embodiment.

FIG. 8 illustrates a flow chart of the method of the invention in accordance with an embodiment. When the IC is powered on, the BIST algorithm is executed and any defects found in the memory array are detected, as indicated by block 101. If any defects are detected, BIST repair occurs and any defective memory locations are remapped to redundant memory, after which the BIST algorithm is re-executed to validate the repair, as indicated by block 102. If the user desires to know whether remapping occurred, the user causes the remap bits to be ported out of the IC, as indicated by block 103. Those bits may be received by a computer, as described above with reference to FIG. 6, which processes them and causes them to be displayed to the user. This step is represented by block 104. This information may be displayed in a format that allows the user to easily ascertain the locations that have been remapped to redundant memory. As an alternative to displaying the information on a display monitor, the information may be printed out on a printer. Alternatively, the state of the remapping registers may be stored elsewhere, either in the system in which the IC is embedded or in a location accessible to the system. In this manner, the consistency of the repair location may be examined over repeated power cycles of the IC containing the redundant memory.

It should be noted that the present invention has been described with reference to the certain embodiments to demonstrate the principles and concepts of the invention. However, the invention is not limited to the embodiments described herein. Modifications may be made to the embodiments described herein, and all such modifications are within the scope of the invention.

What is claimed is:

1. A memory device comprising:
    a memory array;
    a redundant memory portion in the memory array;

remapping logic configured to remap a defective location in the memory array to a location in the redundant memory portion; and output logic configured to output one or more bits associated with the remapping from the memory device, wherein said one or more bits indicate whether or not the remapping logic has remapped a defective location in the memory array to a location in the redundant memory portion.

2. The memory device of claim 1, wherein said one or more bits correspond to bits stored in one or more respective remap registers of the remapping logic.

3. The memory device of claim 1, wherein said one or more bits correspond to bits that describe a physical connection in the remapping logic that remaps the defective memory location to a location in the redundant memory portion.

4. The memory device of claim 1, wherein the output logic comprises:

a first multiplexer that selects between first and second inputs, the first input corresponding to a data path over which data read from the memory array travels, the second input corresponding to an output of a remap register; and a remapping observation control signal that controls the selections made by the multiplexer.

5. The memory device of claim 4, further comprising:

a second multiplexer that selects between an output of a first remap register and an output of a second remap register, the second multiplexer having an output that is connected to an input of the first multiplexer, wherein the selections made by the second multiplexer are controlled by at least one address bit line used to address the memory array.

6. The memory device of claim 1, wherein the redundant memory portion comprises one or more rows in the memory array.

7. The memory device of claim 1, wherein the redundant memory portion comprises one or more columns in the memory array.

8. The memory device of claim 1, wherein the redundant memory portion comprises one or more blocks in the memory array.

9. A computer system for processing memory remapping information and displaying a description of memory remapping on a display monitor, the computer system comprising:

a processor programmed to receive and process one or more bits relating to a manner in which a memory device of an integrated circuit (IC) has been remapped;

a memory element that stores code to be executed by the processor, wherein the memory element includes remapping logic configured to remap a defective location in the memory array to a location in the redundant memory portion, and output logic configured to output one or more bits associated with the remapping from the memory device, wherein said one or more bits indicate whether or not the remapping logic has remapped a defective location in the memory array to a location in the redundant memory portion; and a display monitor that displays a description of a manner in which the memory device of the IC has been remapped.

10. A method for determining whether a memory device of an integrated circuit (IC) has been remapped, the method comprising:

outputting from the memory device one or more bits associated with a remapping of a location in the memory device from a defective location to a location in a redundant memory portion, wherein said one or more bits indicate whether or not the defective location in the memory array has been remapped to a location in the redundant memory portion; and processing said one or more bits to generate a description of any remapping that has occurred.

11. The method of claim 10, further comprising:

displaying the description of the remapping on a display monitor.

12. The method of claim 10, wherein the outputting step comprises:

asserting a control signal that causes remapping bits to be ported out of the memory device.

13. The method of claim 12, wherein the control signal is received at a selector input of a multiplexer, the control signal causing the multiplexer to select between first and second inputs, the first input corresponding to a data path over which data read from the memory array travels, the second input corresponding to an output of a remap register that has said one or more bits stored in it.

14. The method of claim 10, wherein the description is an indication of whether or not remapping has occurred.

15. The method of claim 10, wherein the description is a description of a manner in which the memory device has been remapped.

16. A computer memory device having computer program instructions stored thereon for processing one or more bits associated with remapping of a memory device, the computer memory device comprising:

a first code segment for receiving said one or more bits, said one or more bits being output from a memory device of an integrated circuit (IC), wherein said one or more bits indicate whether or not a defective location in the memory device has been remapped to a location in a redundant memory portion; and a second code segment for processing said one or more bits to generate a description of a manner in which the memory device has been remapped.

17. The computer memory device of claim 16, further comprising:

a third code segment for displaying the description on a display monitor.

18. The computer memory device of claim 16, further comprising:

a third code segment for printing the description on a printer.

19. The computer memory device of claim 16, further comprising:

a third code segment for storing said description in a system which can be accessed to compare a consistency of said description over a plurality of power cycles or remappings of the device.

* * * * *